(12) United States Patent
Walter (10) Patent No.: US 10,141,247 B2
(45) Date of Patent: Nov. 27, 2018

(54) POWER SEMICONDUCTOR DEVICE

(71) Applicant: SEMIKRON ELEKTRONIK GMBH & CO. KG, Nuremberg (DE)

(72) Inventor: Christian Walter, Ansbach (DE)

(73) Assignee: SEMIKRON ELEKTRONIK GMBH & CO. KG, Nuremberg (DE)

(*) Notice: Subject to any disclaimer, the term of this patent is extended or adjusted under 35 U.S.C. 154(b) by 12 days.

(21) Appl. No.: 15/643,851

(22) Filed: Jul. 7, 2017

(65) Prior Publication Data

US 2018/0019190 A1     Jan. 18, 2018

(30) Foreign Application Priority Data

Jul. 12, 2016   (DE) .................. 10 2016 112 777

(51) Int. Cl.
  *H01L 23/49*     (2006.01)
  *H01L 23/495*    (2006.01)
  (Continued)

(52) U.S. Cl.
  CPC ........ *H01L 23/49562* (2013.01); *H01L 23/48* (2013.01); *H01L 23/49575* (2013.01);
  (Continued)

(58) Field of Classification Search
  CPC . H01L 23/049; H01L 23/48; H01L 23/49562; H01L 23/49575; H01L 23/642;
  (Continued)

(56) References Cited

U.S. PATENT DOCUMENTS 7,187,074 B2 * 3/2007 Uchiyama .......... H01R 13/2421
                                                    257/177
8,182,273 B2 * 5/2012 Lederer ................... H01L 23/48
                                                    439/81
(Continued)

FOREIGN PATENT DOCUMENTS

DE     10 2009 046 403      5/2011
DE     10 2014 106 570      11/2015

OTHER PUBLICATIONS

DE 10 2016 112 777.9, Search Report dated Jun. 7, 2017, 6 pages—German, 3 pages—English.

*Primary Examiner* — Hien Nguyen
(74) *Attorney, Agent, or Firm* — Andrew F. Young, Esq.; Lackenbach Siegel, LLP (57) ABSTRACT

The invention relates to a power semiconductor device with a substrate and an electrically conductive DC voltage bus bar system and a capacitor connected to the bus bar system, wherein the power semiconductor device has, for securing the capacitor, a capacitor securing apparatus comprising a receptacle device for receiving the capacitor, in which at least part of the capacitor is arranged. Electrically conductive bus bar system terminal elements are electrically connected thereto and run in the direction of the substrate. An elastic first deformation element is materially bonded to the capacitor securing apparatus and is formed from an elastomer is arranged on the side of the capacitor securing apparatus facing the DC voltage bus bar system. The device is embodied in such a way that the capacitor securing apparatus, via the deformation element, presses the DC voltage bus bar system in the direction of the substrate and thereby presses the bus bar system terminal elements against electrically conductive contact areas of the substrate such that the bus bar system terminal elements are electrically (Continued)

conductively pressure-contacted with said contact areas of the substrate.

13 Claims, 5 Drawing Sheets

(51) Int. Cl.

| | |
|---|---|
| *H01L 23/48* | (2006.01) |
| *H01L 23/00* | (2006.01) |
| *H01L 25/07* | (2006.01) |
| *H05K 7/14* | (2006.01) |
| *G11C 11/00* | (2006.01) |
| *H01L 23/36* | (2006.01) |
| *H01L 23/373* | (2006.01) |

(52) U.S. Cl.
CPC .............. *H01L 24/34* (2013.01); *H01L 25/07* (2013.01); *H05K 7/1432* (2013.01); *H01L 23/36* (2013.01); *H01L 23/3735* (2013.01); *H01L 24/29* (2013.01); *H01L 24/32* (2013.01); *H01L 24/83* (2013.01); *H01L 2224/29101* (2013.01); *H01L 2224/33* (2013.01); *H01L 2224/48247* (2013.01); *H01L 2224/8384* (2013.01); *H01L 2224/83801* (2013.01)

(58) Field of Classification Search
CPC ......... H01L 24/34; H01L 24/48; H01L 24/49; H01L 25/072; H01L 28/40
USPC .......................................... 365/222, 226–227
See application file for complete search history.

(56) References Cited

U.S. PATENT DOCUMENTS

| | | | |
|---|---|---|---|
| 8,427,836 B2* | 4/2013 | Frank | .................... H01L 23/049 361/728 |
| 2003/0173579 A1* | 9/2003 | Ishii | ...................... H01L 25/072 257/177 |

* cited by examiner

POWER SEMICONDUCTOR DEVICE

CROSS REFERENCE TO RELATED APPLICATIONS

This application relates to and claims priority from German Ser. No. DE 10 2016 112 777.9, filed Jul. 12, 2016, the entire contents of which are incorporated herein by reference.

FIGURE SELECTED FOR PUBLICATION

FIG. 1

BACKGROUND OF THE INVENTION

Field of the Invention

The invention relates to a power semiconductor device with improved connection.

Description of the Related Art

DE 10 2009 046 403 B4 discloses a power semiconductor device comprising a substrate and comprising power semiconductor components arranged on the substrate and electrically conductively connected to the substrate, comprising an electrically conductive DC voltage bus bar system and comprising capacitors electrically conductively connected to the DC voltage bus bar system, wherein the power semiconductor device has, for securing the capacitors, a capacitor securing apparatus having receptacle devices for receiving the capacitors, in which the capacitors are arranged, wherein, from the DC voltage bus bar system, electrically conductive bus bar system terminal elements electrically conductively connected to the DC voltage bus bar system run in the direction towards the substrate, which bus bar system terminal elements, by means of foam elements arranged between blocking elements of the capacitor securing apparatus and the capacitors and not materially bonded to the capacitor securing apparatus, via the capacitors, press the bus bar system terminal elements against electrically conductive contact areas of the substrate, such that the bus bar system terminal elements are electrically conductively pressure-contacted with said contact areas of the substrate.

Since pressure is introduced on the bus bar system terminal elements via the capacitors, the latter are subjected to severe mechanical loading, which can lead to damage or destruction of the capacitors. Furthermore, during the production of the power semiconductor device, the foam elements have to be placed between the blocking elements and the capacitors, which is time-consuming and susceptible to errors since there is the risk of forgetting to insert at least one of the foam elements.

ASPECTS AND SUMMARY OF THE INVENTION

According to one alternative aspect of the present invention, there is provided a power semiconductor device including a substrate and power semiconductor components, comprising an electrically conductive DC voltage bus bar system and comprising a capacitor electrically conductively connected to the DC voltage bus bar system, wherein the power semiconductor device has, for securing the capacitor, a capacitor securing apparatus comprising a receptacle device for receiving the capacitor, in which at least part of the capacitor is arranged, wherein, from the DC voltage bus bar system, electrically conductive bus bar system terminal elements electrically conductively connected thereto run in the direction of the substrate, wherein at least one elastic first deformation element which is materially bonded to the capacitor securing apparatus and is formed from an elastomer is arranged on the side of the capacitor securing apparatus facing the DC voltage bus bar system, wherein the power semiconductor device is embodied in such a way that the capacitor securing apparatus, via the at least one first deformation element, presses the DC voltage bus bar system in the direction of the substrate and thereby presses the bus bar system terminal elements against electrically conductive contact areas of the substrate such that the bus bar system terminal elements are electrically conductively pressure-contacted with said contact areas of the substrate.

It is an object of the invention to provide an efficiently producible reliable power semiconductor device in which the capacitors of the power semiconductor device are subjected to little mechanical loading.

This object is achieved by means of a power semiconductor device comprising a substrate and comprising power semiconductor components arranged on the substrate and electrically conductively connected to the substrate, comprising an electrically conductive DC voltage bus bar system and comprising a capacitor electrically conductively connected to the DC voltage bus bar system, wherein the power semiconductor device has, for securing the capacitor, a capacitor securing apparatus comprising a receptacle device for receiving the capacitor, in which at least part of the capacitor is arranged, wherein, from the DC voltage bus bar system, electrically conductive bus bar system terminal elements electrically conductively connected thereto run in the direction of the substrate, wherein at least one elastic first deformation element which is materially bonded to the capacitor securing apparatus and is formed from an elastomer is arranged on the side of the capacitor securing apparatus facing the DC voltage bus bar system, wherein the power semiconductor device is embodied in such a way that the capacitor securing apparatus, via the at least one first deformation element, presses the DC voltage bus bar system in the direction of the substrate and thereby presses the bus bar system terminal elements against electrically conductive contact areas of the substrate such that the bus bar system terminal elements are electrically conductively pressure-contacted with said contact areas of the substrate.

Advantageous embodiments of the invention are further evident from the disclosure herein.

It proves to be advantageous if part of the at least one first deformation element is arranged in a cutout of the capacitor securing apparatus, said cutout being assigned to the respective first deformation element, since then the at least one first deformation element is connected to the capacitor securing apparatus in a manner enabling very high mechanical loading.

It proves to be advantageous if the power semiconductor device has an AC load current conduction element, wherein the capacitor securing apparatus has a pressure element, wherein an elastic second deformation element, which is materially bonded to the pressure element and is formed from an elastomer, is arranged on a side of the pressure element facing the AC load current conduction element, wherein the power semiconductor device is embodied in such a way that the capacitor securing apparatus, via the second deformation element, presses the AC load current conduction element against an electrically conductive further contact area of the substrate, such that the AC load current conduction element is electrically conductively pressure-contacted with the substrate. As a result, the AC load current conduction element is electrically conductively pressure-contacted with the substrate in a very reliable manner.

Furthermore, it proves to be advantageous if part of the second deformation element is arranged in a cutout of the pressure element, said cutout being assigned to the second deformation element, since then the second deformation element is connected to the pressure element in a manner enabling very high mechanical loading.

Furthermore, it proves to be advantageous if the power semiconductor device has a printed circuit board, wherein the capacitor securing apparatus has a blocking element, wherein an elastic third deformation element, which is materially bonded to the blocking element, is formed from an elastomer and has a mechanical contact with the printed circuit board, is arranged on the side of the blocking element facing the printed circuit board. Mechanical loads, in particular mechanical vibration loads, acting on the printed circuit board are reduced as a result.

Furthermore, it proves to be advantageous if part of the third deformation element is arranged in a cutout of the blocking element, said cutout being assigned to the third deformation element, since then the third deformation element is connected to the blocking element in a manner enabling very high mechanical loading.

Furthermore, it proves to be advantageous if the receptacle device has a receptacle element, wherein the capacitor is arranged between the receptacle element and the DC voltage bus bar system, wherein an elastic fourth deformation element, which is materially bonded to the receptacle element, is formed from an elastomer and has a mechanical contact with the capacitor, is arranged on the side of the receptacle element facing the capacitor. Mechanical loads, in particular mechanical vibration loads, acting on the respective capacitor are reduced as a result.

Furthermore, it proves to be advantageous if the elastomer is embodied as crosslinked silicone rubber, in particular as crosslinked liquid silicone rubber or as crosslinked solid silicone rubber, since a silicone rubber has particularly good elastic properties.

Furthermore, it proves to be advantageous if the DC voltage bus bar system has an electrically conductive positive potential bus bar and an electrically conductive negative potential bus bar, which are arranged in a manner electrically insulated from one another by an electrically non-conductive insulation layer arranged between the positive potential bus bar and the negative potential bus bar, since then the positive potential bus bar and the negative potential bus bar are reliably electrically insulated from one another.

Furthermore, it proves to be advantageous if the respective bus bar system terminal element is embodied integrally with the positive potential bus bar or with the negative potential bus bar, since then the bus bar system terminal elements are producible in a particularly simple manner.

Furthermore, it proves to be advantageous if the mechanical contact area which the at least one first deformation element has with the DC voltage bus bar system is a maximum of 70%, in particular a maximum of 40%, in particular a maximum of 20%, of the area of the DC voltage bus bar system facing the capacitor securing apparatus, wherein the at least one first deformation element has a mechanical contact with the regions of the DC voltage bus bar system that are arranged in direct proximity to the bus bar system terminal elements. As a result, the introduction of force from the capacitor securing apparatus to the DC voltage bus bar system for realizing the pressure contacting of the bus bar system terminal elements with the electrically conductive contact areas of the substrate takes place mechanically expediently substantially in a targeted manner in the locations at which the bus bar system terminal elements are arranged.

Furthermore, it proves to be advantageous if the power semiconductor device has a metallic main body and a pressure generating means, wherein the substrate is arranged on the main body, wherein the pressure generating means exerts pressure on the capacitor securing apparatus in the direction of the substrate and the capacitor securing apparatus thereby presses the DC voltage bus bar system, via the at least one first deformation element, in the direction of the substrate. As a result, pressure is exerted on the capacitor securing apparatus in the direction of the substrate reliably and stably over the long term.

Furthermore, it proves to be advantageous if the pressure generating means is embodied as at least one screw, since then the pressure generating means is embodied in a particularly simple manner.

Furthermore, it proves to be advantageous if the substrate is embodied as a direct copper bonded substrate or as an insulated metal substrate, since these constitute substrates embodied in a particularly reliable manner.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Figure 1:
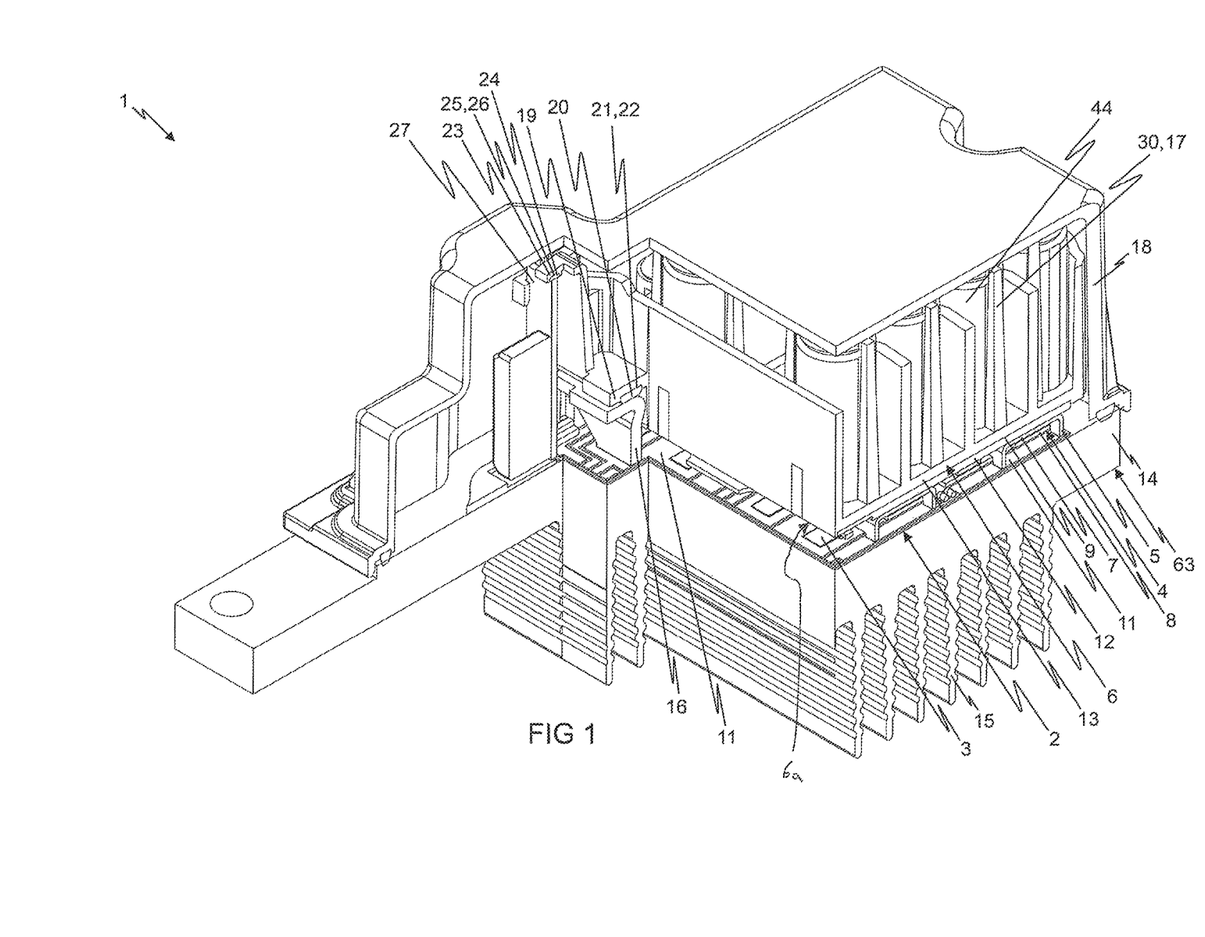
FIG. 1 shows a perspective partial cross-sectional view of a combined power semiconductor device according to the invention.
Figure 2:
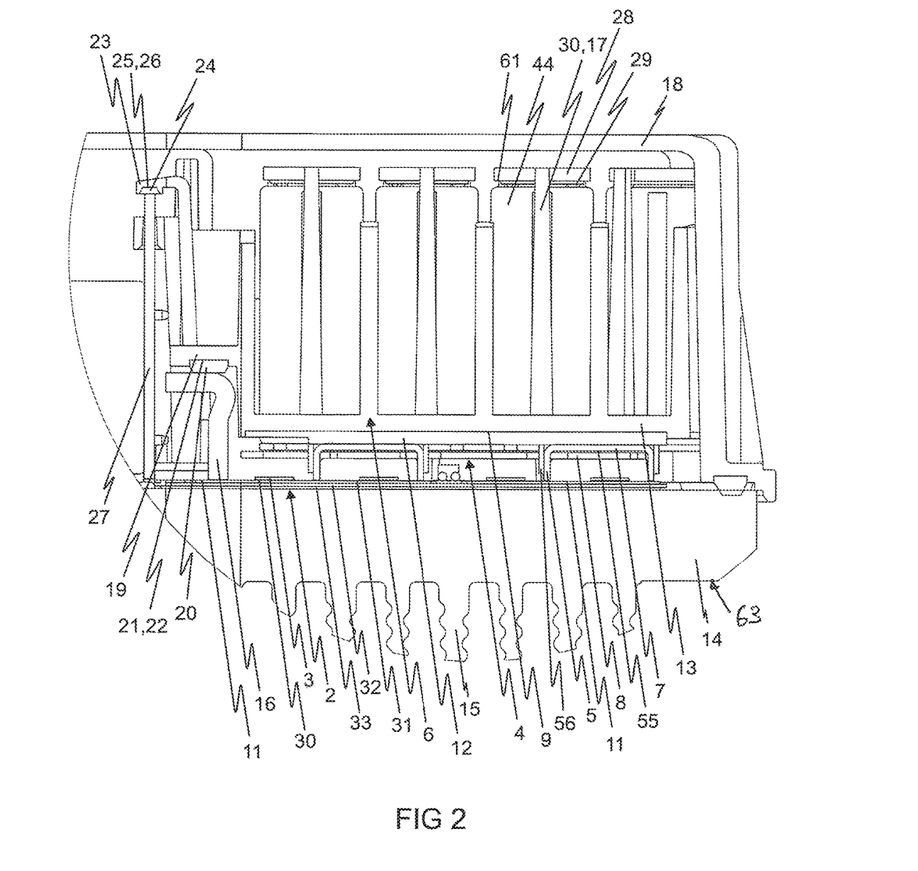
FIG. 2 shows a partial cross-sectional detail view from FIG. 1 in a perspective from the side.
Figure 3:
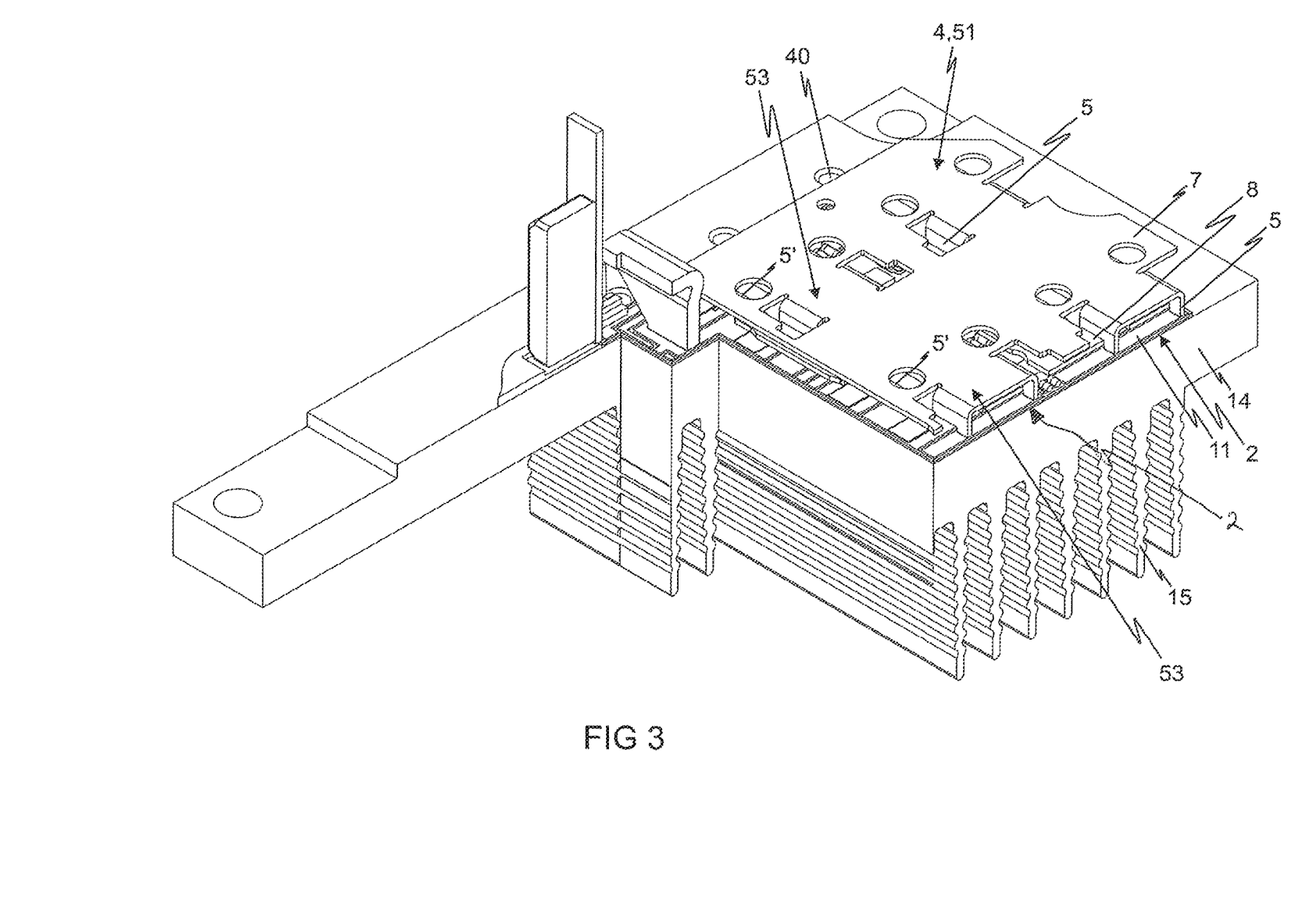
FIG. 3 shows a perspective cross-sectional view of a DC voltage bus bar system of the power semiconductor device, said DC voltage bus bar system being shown arranged on a substrate as in FIG. 1.
Figure 4:
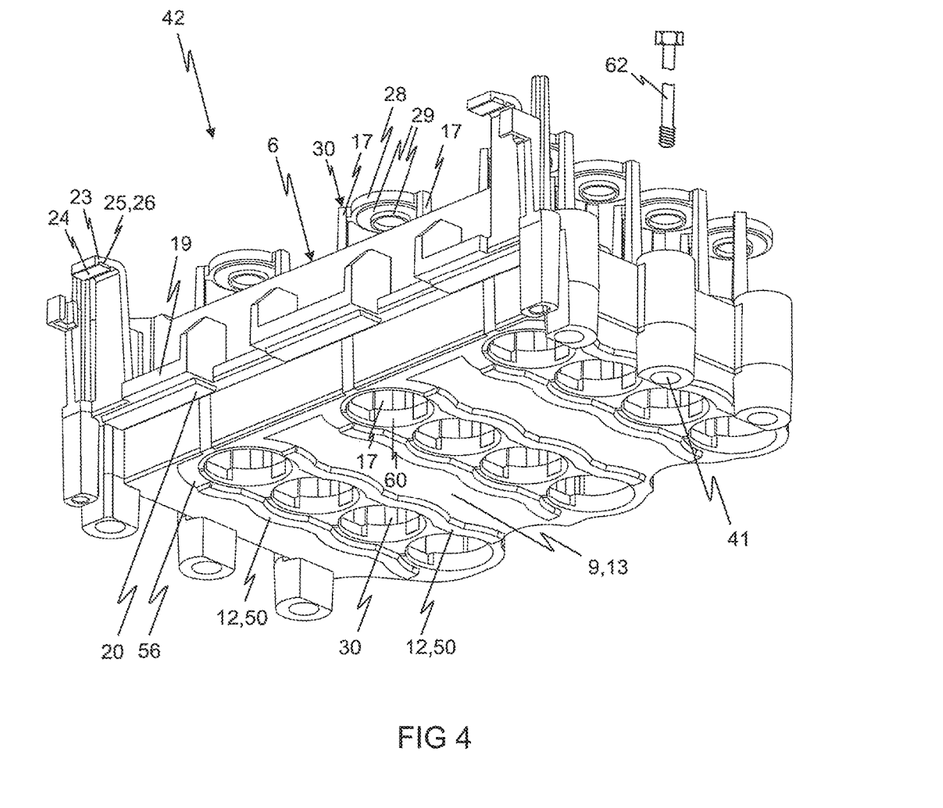
FIG. 4 shows a perspective view from below of a capacitor securing apparatus and first deformation elements of the power semiconductor device.
Figure 5:
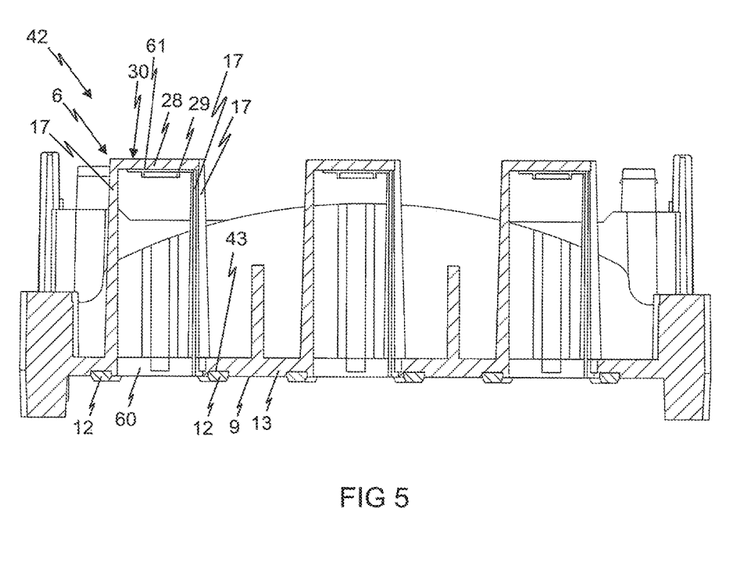
FIG. 5 shows a partial cross-sectional view of a capacitor securing apparatus and first deformation elements of the power semiconductor device.

FIG. 1 illustrates a perspective sectional view of a power semiconductor device 1 according to the invention, and FIG. 2 illustrates a detail view from FIG. 1 in a perspective from the side. FIG. 3 to FIG. 5 illustrate different views of elements of the power semiconductor device 1 according to the invention.

The power semiconductor device 1 according to the invention has a protective cover 18 and a substrate 2, on which power semiconductor components 3 electrically conductively connected to the substrate 2 are arranged. The respective power semiconductor component 3 is preferably present in the form of a power semiconductor switch or a diode, but is not limited thereto. In this case, the power semiconductor switches are generally present in the form of transistors, such as e.g. IGBTs (Insulated Gate Bipolar Transistor) or MOSFETs (Metal Oxide Semiconductor Field Effect Transistor), or in the form of thyristors. The substrate 2 has an insulating substance body 32 (e.g. ceramic body) and an electrically conductive structured first conduction layer 31, which is arranged on a first side of the insulating substance body 32 and is connected to the insulating substance body 32 and forms electrically conductive contact areas 11 owing to its structure. Preferably, the substrate 2 has an electrically conductive, preferably unstructured, second conduction layer 33, wherein the insulating substance body 32 is arranged between the structured first conduction layer 31 and the second conduction layer 33. The substrate 2 can be present, as in the exemplary embodiment, e.g. in the form of a direct copper bonded substrate (DCB substrate) or in the form of an insulated metal substrate (IMS). The power semiconductor components 3 are preferably connected to assigned contact areas 6a of the substrate 6 in a materially bonded manner (e.g. by means of a soldering or sintering layer).

The power semiconductor device 1 furthermore has an electrically conductive DC voltage bus bar system 4 and capacitors 44 electrically conductively connected to the DC voltage bus bar system 4 via their electrical terminal elements 56. The DC voltage bus bar system 4 has an electrically conductive positive potential bus bar 7 and an electrically conductive negative potential bus bar 8, which are preferably arranged in a manner electrically insulated from one another by an electrically non-conductive insulation layer 55 (e.g. plastic film) arranged between the positive potential bus bar 7 and the negative potential bus bar 8.

In the context of the exemplary embodiment, the power semiconductor components 3 are electrically interconnected to form half-bridge circuits that can be used e.g., for rectifying and inverting electrical voltages and currents. The power semiconductor device 1 has the capacitors 44 as an electrical energy store, said capacitors buffering a DC voltage occurring at the power semiconductor device 1. In the exemplary embodiment, the capacitors 44 serve in this way as link capacitors, but they can also serve a different purpose. In the simplest case, it is also possible for just a single capacitor 44 to be present.

The power semiconductor device 1 has, for securing the capacitors 44, the substrate 6 serving as a capacitor securing apparatus 6 having receptacle devices 30 for receiving the capacitors 44. At least part of the respective capacitor 44 is arranged in the respective receptacle device 30. In the context of the exemplary embodiment, the capacitor securing apparatus 6 has a capacitor securing plate 13 provided with openings for the capacitors 44, from which plate webs 17 arranged around the openings 60 of said plate, which webs frame the capacitors 44 when combined and in this way form the receptacle devices 30, extend in a direction away from the substrate 2. The capacitor securing apparatus 6 is preferably embodied in an integral fashion. The capacitor securing apparatus 6 is preferably formed from plastic, in particular as a plastic injection-molded part.

From the DC voltage bus bar system 4, electrically conductive bus bar system terminal elements 5 and 5' electrically conductively connected to the DC voltage bus bar system 4 run in the direction of the substrate 2. The electrical terminal elements 56 of the capacitors 44 are electrically conductively contacted with the bus bar system terminal elements 5 and 5' in a materially bonded manner (e.g. by means of a soldering, sintering or welding connection). The respective bus bar system terminal element 5 and 5' is embodied integrally with the positive potential bus bar 7 or with the negative potential bus bar 8.

At least one elastic first deformation element 12 which is materially bonded to the capacitor securing apparatus 6 and is formed from an elastomer is arranged on the side 9 of the capacitor securing apparatus 6 facing the DC voltage bus bar system 4, wherein preferably a plurality of first deformation elements 12 are arranged on the side 9 of the capacitor securing apparatus 6 facing the DC voltage bus bar system 4. The power semiconductor device 1 is embodied in such a way that the capacitor securing apparatus 6, via the at least one first deformation element 12, presses the DC voltage bus bar system 4 in the direction of the substrate 2 and thereby presses the bus bar system terminal elements 5 and 5' against the electrically conductive contact areas 11 of the substrate 2, such that the bus bar system terminal elements 5 and 5' are electrically conductively pressure-contacted with said contact areas 11 of the substrate 2.

Since the introduction of pressure on the bus bar system terminal elements 5 and 5' in the case of the invention takes place via the capacitors 44 only to a very small extent or not at all, but rather via the side 9 of the capacitor securing apparatus 6 facing the DC voltage bus bar system 4, in the case of the invention said capacitors are subjected to only very low or no mechanical loading and thus have a very long lifetime. Since the at least one first deformation element 12 is materially bonded to the capacitor securing apparatus 6 and the capacitor securing apparatus 6 and the at least one first deformation element 12 thus form a structural unit 42, it is not possible to forget the technologically routine insertion e.g., of a foam element during the production of the power semiconductor device 1, such that the power semiconductor device 1 is efficiently producible in a reliable manner.

A mechanical contact area 50 which the at least one first deformation element 12 has with the DC voltage bus bar system 4 is preferably a maximum of 70%, in particular a maximum of 40%, in particular a maximum of 20%, of a facing area 51 of the DC voltage bus bar system 4 facing the capacitor securing apparatus 6 (see FIG. 3), wherein the at least one first deformation element 12 has a mechanical contact with contact regions 53 of the DC voltage bus bar system 4 that are arranged in direct proximity to the bus bar system terminal elements 5 and 5'. As a result, the introduction of force (during assembly) from the capacitor securing apparatus 6 to the DC voltage bus bar system 4 for realizing the pressure contacting of the bus bar system terminal elements 5 and 5' with the electrically conductive contact areas 11 of the substrate 2 is effected substantially in a targeted manner and thus mechanically expediently proximate at the locations at which the bus bar system terminal elements 5 and 5' are arranged.

Part of the at least one first deformation element 12 is arranged in a cutout 43 (see cross-sectional-view FIG. 5) of the capacitor securing apparatus 6, said cutout being assigned thereto.

The first deformation elements 12 can be connected to one another via connection sections 56 formed from the elastomer from which the deformation elements 5 are formed.

The power semiconductor device 1 preferably has an AC load current conduction element 16 and a pressure element 19, wherein an elastic second deformation element 20, which is materially bonded to the pressure element 19 and is formed from an elastomer, is arranged on a side 21 of a cut out 22 of the pressure element 19 facing the AC load current conduction element 16, wherein the power semiconductor device 1 is embodied in such a way that the capacitor securing apparatus 6, via the second deformation element 20, presses the AC load current conduction element 16 against an electrically conductive further contact area 11 of the substrate 2, such that the AC load current conduction element 16 is electrically conductively pressure-contacted with the substrate 2.

The power semiconductor device 1 furthermore preferably has a printed circuit board 27, and the capacitor securing apparatus 6 has a blocking element 23. An elastic third deformation element 24, which is materially bonded to the blocking element 23, is formed from an elastomer and has a mechanical contact with the printed circuit board 27, is arranged on the side 25 of the blocking element 23 facing the printed circuit board 27. The printed circuit board 27 is connected to the rest of the power semiconductor device 1 in a vibration-resistant manner via the elastic third deformation element 24. Mechanical loads, in particular mechanical vibration loads, acting on the printed circuit board 27 are reduced by the elastic third deformation element 24. Part of the third deformation element 24 is preferably arranged in a cutout 26 of the blocking element 23, said cutout being assigned to the third deformation element 24. By way of example, driver circuits for driving the power semiconductor components 3 can be arranged on the printed circuit board 27.

The receptacle device 30 preferably has a receptacle element 28, wherein the capacitor 44 is arranged between the receptacle element 28 and the DC voltage bus bar system 4. An elastic fourth deformation element 29, which is materially bonded to the receptacle element 28, is formed from an elastomer and has a mechanical contact with the capacitor 44, is arranged on the side 61 of the receptacle element 28 facing the capacitor 44. Mechanical loads, in particular vibration loads, acting on the respective capacitor 44 are reduced by the elastic fourth deformation element 29.

The elastomer is preferably embodied as crosslinked silicone rubber, in particular as crosslinked liquid silicone rubber or as crosslinked solid silicone rubber.

The capacitor securing apparatus 6 together with the deformation elements 12, 20, 24, 29 forms a structural unit 42, such that the power semiconductor device 1 is producible particularly efficiently. The structural unit 42 is preferably produced in such a way that the capacitor securing apparatus 6 is produced as a plastic injection-molded part, and is subsequently arranged in a countermold designed for forming the elastic deformation elements by injection technology, and then the elastomer in its uncrosslinked chemical precursor form (e.g., uncrosslinked silicone rubber) for forming the elastic deformation elements is injected into the countermold and undergoes crosslinking therein.

In the simplest case, the capacitor securing apparatus 6 can press the DC voltage bus bar system 4 in the direction of the substrate 2 via the at least one first deformation element 12 by virtue of the requisite pressure force being generated by the gravitational force that presses the capacitor securing apparatus 6 against the DC voltage bus bar system 4 if the capacitor securing apparatus 6 is arranged above the DC voltage bus bar system 4, relative to the center of the Earth.

The power semiconductor device 1 preferably has a metallic main body 63 and a pressure generating means 62. The substrate 2 is arranged on the main body 63. In this case, the substrate 2 can be materially bonded to the main body 63 via a soldering or sintering layer arranged between the main body 63 and the substrate 2. Alternatively, a thermally conductive paste can be arranged between the substrate 2 and the main body 63. The pressure generating means 62 exerts pressure on the capacitor securing apparatus 6 in the direction of the substrate 2.

As a consequence, the capacitor securing apparatus 6 presses the DC voltage bus bar system 4, via the at least one first deformation element 12, in the direction of the substrate 2, such that the bus bar system terminal elements 5 and 5' press against the electrically conductive contact areas 11 of the substrate 2. The pressure generating means 62 is preferably embodied as at least one screw 62. In the context of the exemplary embodiment, the capacitor securing apparatus 6 has through holes 41 through which a section of the screws 62 is led and the screws 62 are screwed into corresponding holes 40 (see FIG. 3) in the main body 63 that are provided with an internal thread. Alternatively, the holes 40 in the main body 63 may also have no internal thread and the screws 62 pass through the holes 40 and are screwed together with screw nuts (not shown) on the side of the main body 63 facing away from the substrate 2.

The main body 63 can be embodied as a heat sink 63, as in the exemplary embodiment, for example. The heat sink 63 can have cooling fins 15 or cooling pins which preferably extend from a baseplate 14 of the heat sink 63. The substrate 2 is arranged on the baseplate 14 of the heat sink 63. The heat sink 63 can be embodied as air-based heat sink or water-based heat sink. Alternatively, the main body can also be embodied as a baseplate 14 (without cooling fins 15 or cooling pins) that is provided for mounting onto a heat sink (e.g. air-based heat sink or water-based heat sink).

It goes without saying that, unless excluded per se, the features mentioned in the singular, in particular the second, third and fourth deformation elements, can also be present multiply in the power semiconductor device according to the invention.

It should be noted at this juncture that, of course, features of different exemplary embodiments of the invention, provided that the features are not mutually exclusive, can be combined arbitrarily with one another.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power semiconductor device, comprising:
   a substrate and power semiconductor components arranged on the substrate and electrically conductively connected to the substrate;
   an electrically conductive DC voltage bus bar system and comprising a capacitor electrically conductively connected to the DC voltage bus bar system;
   wherein the power semiconductor device further comprises:
      a capacitor securing apparatus for securing the capacitor and a receptacle device for receiving the capacitor, in which at least part of the capacitor is arranged;
      wherein, from the DC voltage bus bar system, a plurality of electrically conductive bus bar system terminal elements are electrically conductively connected thereto and run in a direction of the substrate;
      at least one elastic first deformation element is materially bonded to the capacitor securing apparatus and is formed from an elastomer and is arranged on a facing side of the capacitor securing apparatus facing the DC voltage bus bar system;
      wherein the capacitor securing apparatus, via the at least one first deformation element, presses the DC voltage bus bar system in the direction of the substrate and thereby further presses the bus bar system terminal elements against designated electrically conductive contact areas of the substrate such that the bus bar system terminal elements are electrically conductively pressure-contacted with said contact areas of the substrate.

2. The power semiconductor device, according to claim 1, wherein:
   at least part of the at least one first deformation element is arranged in a cutout of the capacitor securing apparatus, said cutout being shaped to securely receive the respective first deformation element.

3. The power semiconductor device, according to claim 1, wherein:
   the power semiconductor device has an AC load current conduction element;
   the capacitor securing apparatus has a pressure element, wherein an elastic second deformation element, is bonded to the pressure element and is formed from an elastomer and is arranged on a pressure side of the pressure element facing the AC load current conduction element;
   wherein the capacitor securing apparatus, via the second deformation element, presses the AC load current conduction element against an electrically conductive further contact area of the substrate, such that the AC load current conduction element is electrically conductively pressure-contacted with the substrate.

4. The power semiconductor device, according to claim 3, wherein:
   a portion of the second deformation element is arranged in a cutout of the pressure element.

5. The power semiconductor device, according to claim 1, wherein:
   the power semiconductor device further comprises:
      a printed circuit board; and
      the capacitor securing apparatus has a blocking element and an elastic third deformation element, which is materially bonded to the blocking element, and that is formed from an elastomer and has a mechanical contact with the printed circuit board and is arranged on a facing side of the blocking element facing the printed circuit board.

6. The power semiconductor device, according to claim 5, wherein:
   at least part the third deformation element is arranged in a cutout of the blocking element.

7. The power semiconductor device, according to claim 1, wherein:
   the receptacle device further comprises:
      a receptacle element, wherein the capacitor is arranged between the receptacle element and the DC voltage bus bar system; and
      an elastic fourth deformation element, which is materially bonded to the receptacle element, is formed from an elastomer and has a mechanical contact with the capacitor, is arranged on a facing side of the receptacle element facing the capacitor.

8. The power semiconductor device, according to claim 1, wherein:
   said at least one elastic first deformation element is a crosslinked silicone rubber from at least one of a crosslinked liquid silicone rubber and a crosslinked solid silicone rubber.

9. The power semiconductor device, according to claim 1, wherein:
   the DC voltage bus bar system has an electrically conductive positive potential bus bar and an electrically conductive negative potential bus bar, which are arranged in a manner electrically insulated from one another and spaced by an electrically non-conductive insulation layer arranged between the positive potential bus bar and the negative potential bus bar.

10. The power semiconductor device, according to claim 9, wherein:
    the respective bus bar system terminal elements are formed integrally with respectively one of the positive potential bus bar and the negative potential bus bar.

11. The power semiconductor device, according to claim 1, further comprising:
    a mechanical contact area is designated on said at least first deformation element relative to the DC voltage bus bar system;
    said mechanical contact are being at between a maximum of 70% of a contact area of the DC voltage bus bar system facing the capacitor securing apparatus; and
    wherein the at least one first deformation element has a mechanical contact with the regions of the DC voltage bus bar system that are arranged in a direct proximity to the bus bar system terminal elements.

12. The power semiconductor device, according to claim 1, wherein:
the power semiconductor device further comprises a metallic main body and a pressure generating means;
the substrate is arranged on the main body; and
the pressure generating means exerts a pressure on the capacitor securing apparatus in a direction of the substrate and the capacitor securing apparatus; thereby pressing the DC voltage bus bar system, via the at least one first deformation element, in the direction of the substrate.

13. The power semiconductor device, according to claim 12, wherein:
the pressure generating means is embodied as at least one screw.

* * * * *